(12) United States Patent
Strydom et al.

(10) Patent No.: US 7,417,504 B2
(45) Date of Patent: Aug. 26, 2008

(54) STARTUP AND SHUTDOWN CLICK NOISE ELIMINATION FOR CLASS D AMPLIFIER

(75) Inventors: Johan Tjeerd Strydom, Santa Clara, CA (US); Jun Honda, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/833,587

(22) Filed: Aug. 3, 2007

(65) Prior Publication Data

US 2008/0030270 A1  Feb. 7, 2008

Related U.S. Application Data

(60) Provisional application No. 60/821,460, filed on Aug. 4, 2006.

(51) Int. Cl.
  *H03F 3/217* (2006.01)
(52) U.S. Cl. ............... 330/251; 330/207 A; 330/302
(58) Field of Classification Search ............... 330/251, 330/207 A, 302
  See application file for complete search history.

(56) References Cited

U.S. PATENT DOCUMENTS

| | | | | |
|---|---|---|---|---|
| 4,589,136 A * | 5/1986 | Poldy et al. | ............... | 381/94.2 |
| 5,767,744 A * | 6/1998 | Irwin et al. | ............... | 330/297 |
| 6,489,840 B2 * | 12/2002 | Botti et al. | ............... | 330/10 |
| 6,720,825 B2 * | 4/2004 | Hansen et al. | ............... | 330/10 |
| 6,940,345 B2 * | 9/2005 | Nair et al. | ............... | 330/51 |
| 6,998,828 B2 * | 2/2006 | Casey et al. | ............... | 323/284 |

* cited by examiner

*Primary Examiner*—Patricia Nguyen
(74) *Attorney, Agent, or Firm*—Ostrolenk, Faber, Gerb & Soffen, LLP (57) ABSTRACT

A method of minimizing an audible click noise from a speaker in a Class D audio power amplifier upon shutdown or startup of a switching stage having two switches series connected at a node, the speaker being connected to the node via an output filter comprising an inductor and a capacitor, the switches being controlled by a controller. The method including the steps of determining a timing interval at the node to transition a peak voltage of the capacitor, the capacitor voltage being a speaker voltage; and eliminating the audible transient voltage excursion across the speaker that causes a click noise during the timing interval, wherein at startup ON and OFF times of the switches are incrementally increased from zero to a normal mode and at shutdown the ON OFF times of the switches are incrementally decreased from the normal mode to zero.

10 Claims, 11 Drawing Sheets

STARTUP AND SHUTDOWN CLICK NOISE ELIMINATION FOR CLASS D AMPLIFIER

CROSS-REFERENCE TO RELATED APPLICATION

This application is based on and claims priority to U.S. Provisional Patent Application Ser. No. 60/821,460, filed on Aug. 4, 2006 and entitled STARTUP AND SHUTDOWN CLICK NOISE ELIMINATION FOR CLASS D AMPLIFIER, the entire disclosure of which is hereby incorporated by reference.

BACKGROUND OF THE INVENTION

The present invention relates to a Class D audio power amplifier and more specifically to a method for minimizing audible click noise from a speaker upon shutdown or startup.

Figure 1:
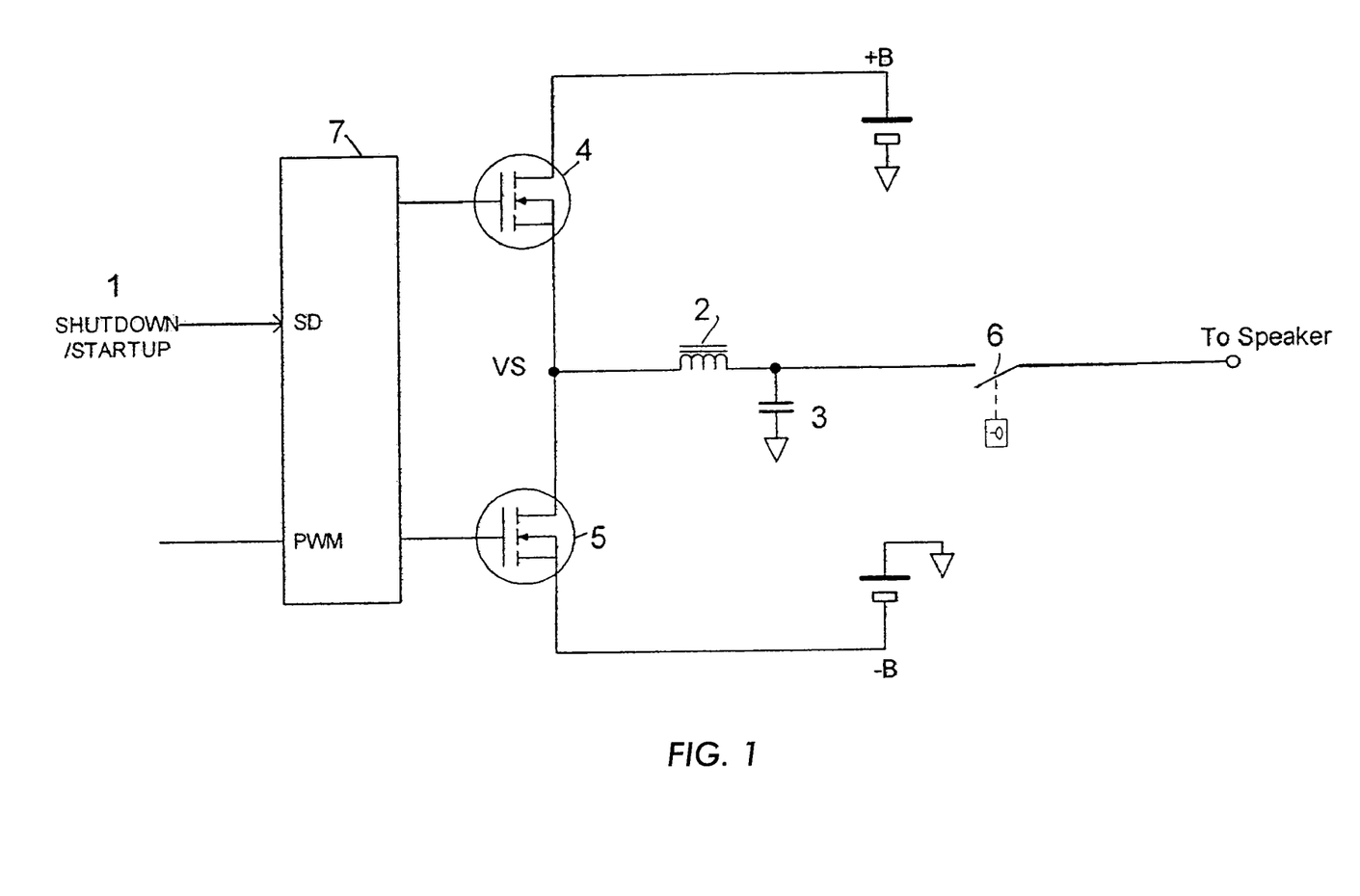
FIG. 1 is a diagram of a commonly used Class D audio amplifier.

FIG. 1 shows an example of a Class D audio amplifier including a switching stage of two switches 4 and 5 series connected at a node VS. Gates of the switches 4 and 5 are controlled by a controller 7 that receives PWM signals for driving and shutdown/startup signals 1 to start and stop the switching stage. The circuit further comprises an LC filter that includes an inductor 2 connected between the VS node and a capacitor 3. As illustrated in FIG. 1, a speaker cut-off switch 6 connects a speaker to the node between the inductor 2 and the capacitor 3.

In the Class D amplifiers, during transition intervals from a total shutdown state to a normal operation state at startup and from the normal operation state to the total shutdown state at shutdown, the energy stored within the output demodulation filter stage 2 and 3 of the amplifier is transitioning to or from a zero energy state. These energy transfers and/or dissipation stages cause a transient voltage excursion on the speaker that contains audible frequency components. Hence click noise is heard from the speaker. The energy that is transferred to the speaker is dependent on both, the current in the output filter inductor 2 and the voltage across the output capacitor 3. Since this noise is an unwanted feature, a bulky speaker cutoff relay 6 is commonly inserted between the amplifier and the speaker to disconnect the speaker during times when these transients are active.

At startup there is a transient, from the initial no energy shutdown state to the normal operation state. The transient is stored within the output filter stage, where a certain amount of energy is circulating between the output stage inductor 2 and capacitor 3. To transition between these two states, energy is transferred to the output filter. This transient causes a rapid change in the voltage across the output filter capacitor and therefore the speaker, which contains audible frequency components.

At shutdown there is a transient from the normal operation state to the shutdown state. A certain amount of energy, circulating between the output stage inductor and capacitor having no energy, is stored within the output filter stage. To transition between these two states, energy within the output filter has to be recovered and/or be dissipated. This transient causes a rapid change of the voltage across the output filter capacitor 3 and therefore the speaker, which contains audible frequency components.

Figure 2A:
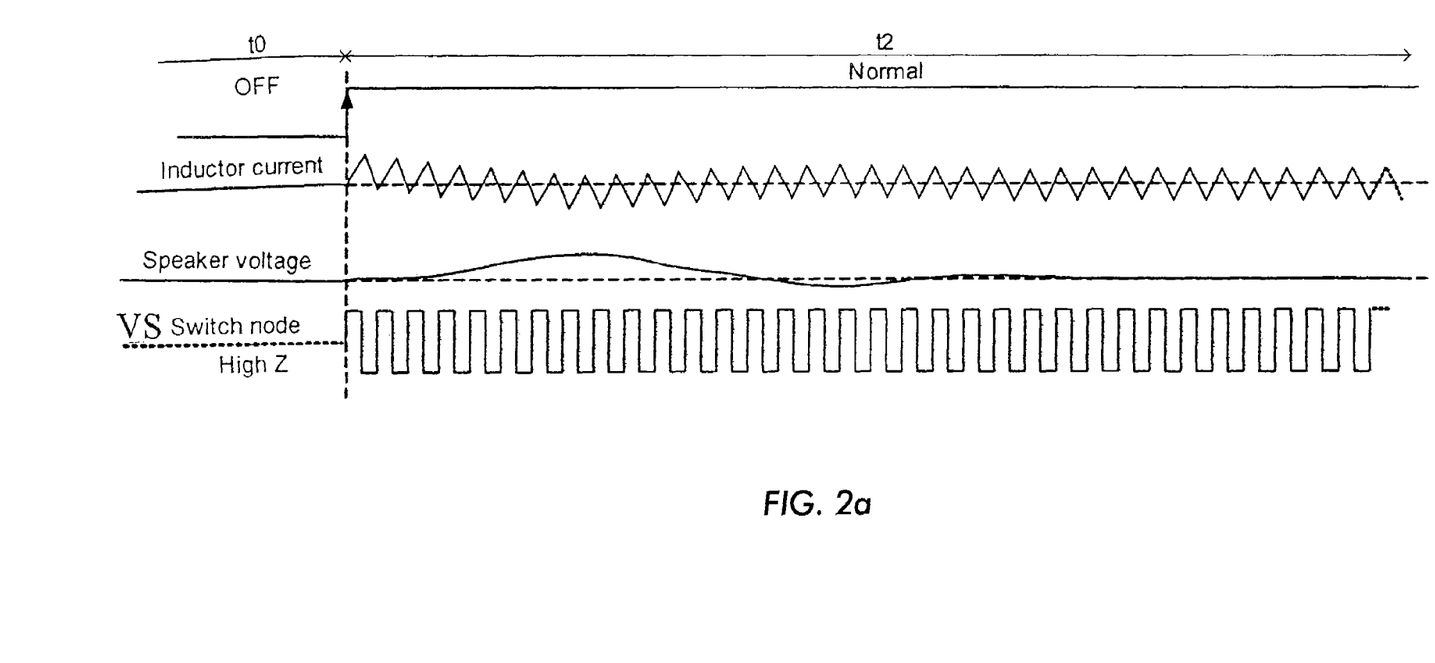
FIGS. 2a and 2b are graphs illustrating changes in inductor current, speaker voltage, and switching node signal values of the commonly used Class D audio amplifier at startup.
Figure 2B:
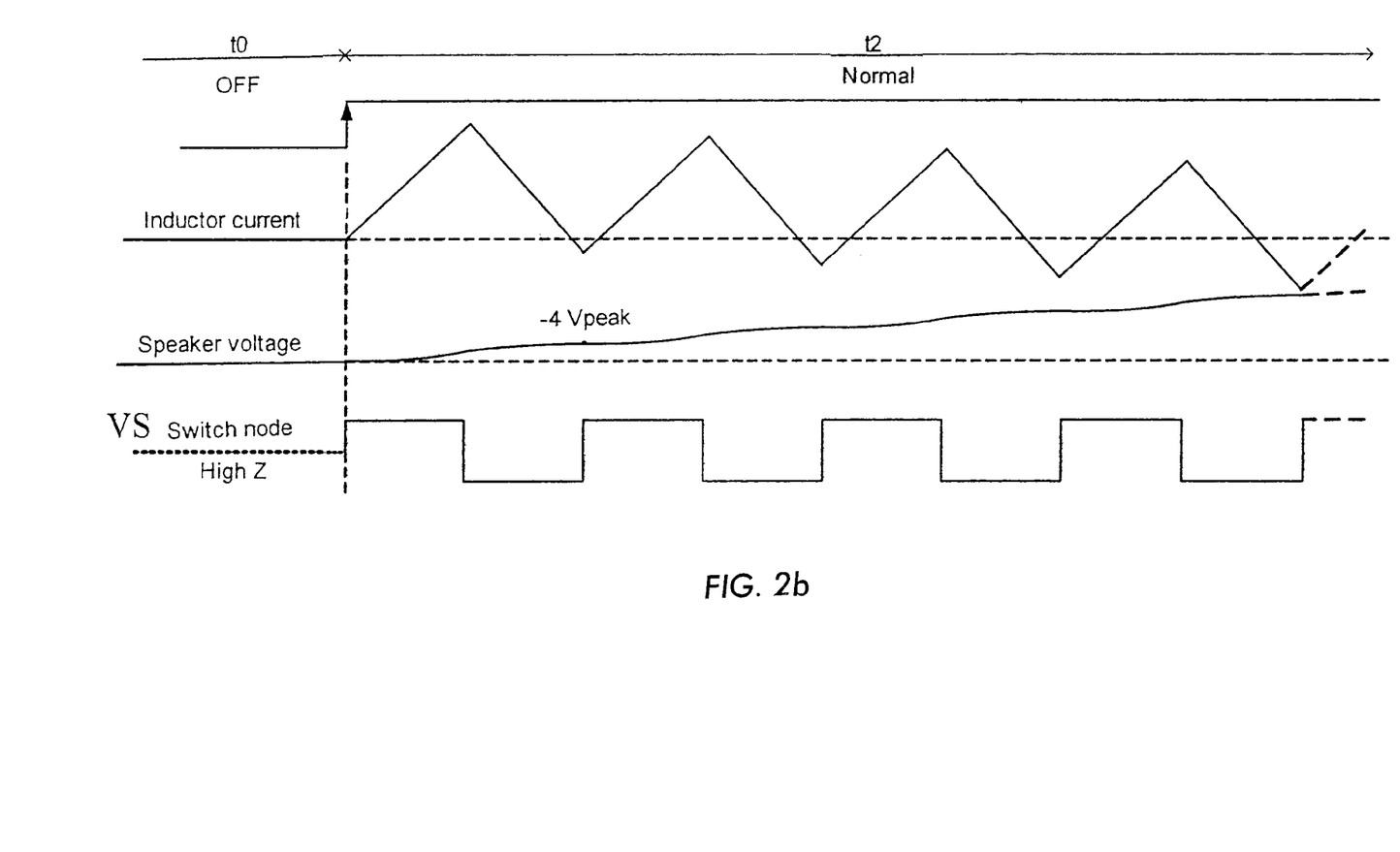

As illustrated in FIG. 2a, during the OFF period t0, both switches 4 and 5 are OFF, resulting in a high impedance state at the node VS. At transition over to the normal operation state at period t2, the PWM driven switching at the node VS is started, and depending on the initial timing, the audible transient response, illustrated by speaker voltage, can be quite significant. Because of this transient, the speaker is only connected to the output after the transient has passed using the switch or relay 6. FIG. 2b is an enlargement of the graphs of FIG. 2a, it illustrates a steady increase in the speaker voltage during the first four switching cycles.

Figure 3A:
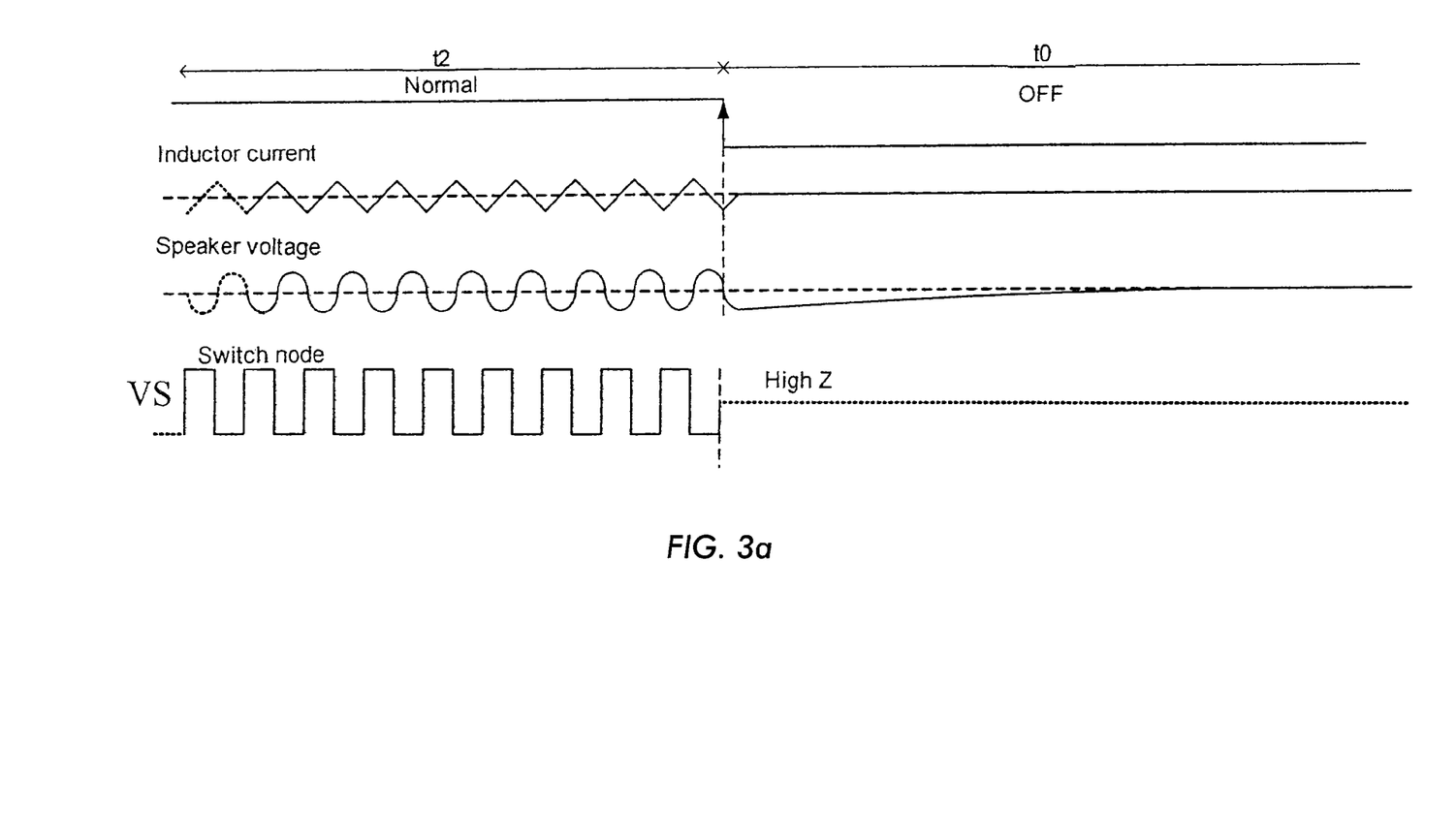
FIGS. 3a and 3b are graphs illustrating changes in inductor current, speaker voltage, and switching node signal values of the commonly used Class D audio amplifier at shutdown.
Figure 3B:
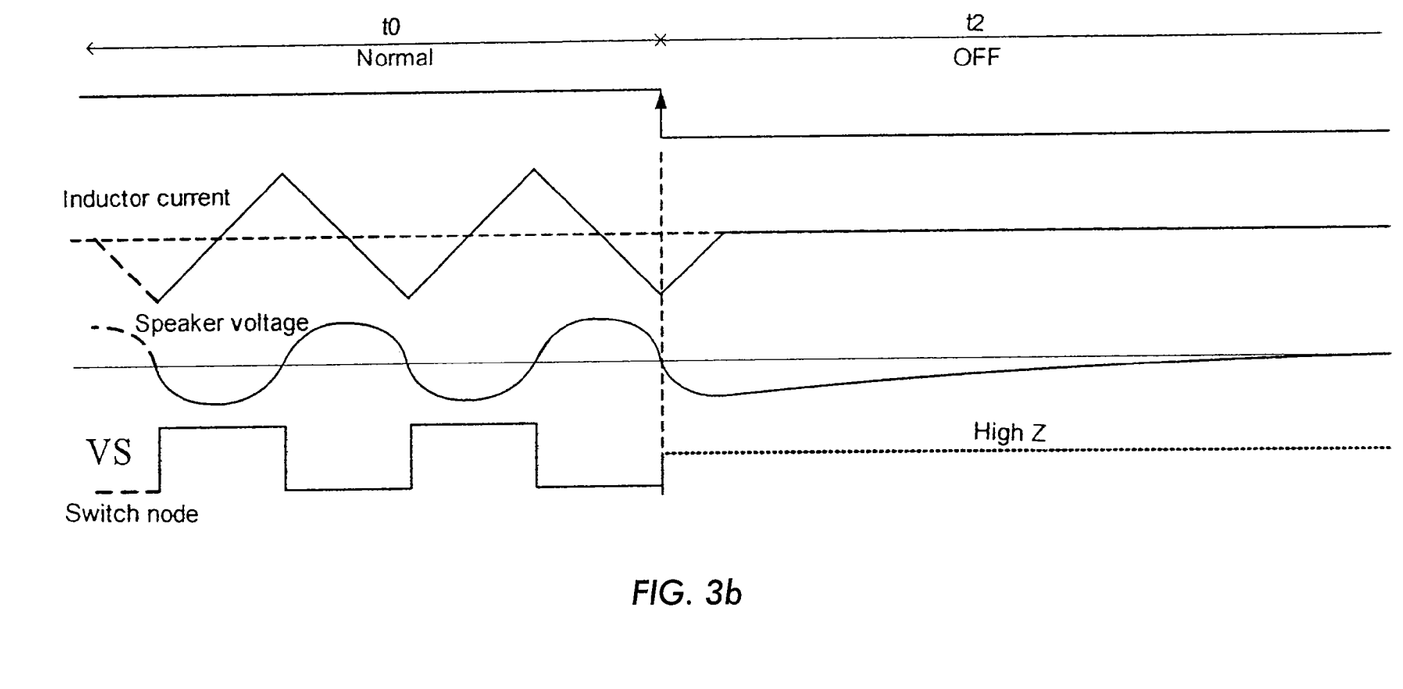

Similarly at shutdown, the speaker is disconnected prior to the shutdown voltage transient is dissipated. As illustrated in FIG. 3a, depending on the final switching timing, the audible transient response can also be quite significant. With the switching ending at maximum inductor energy and current, the audible transient speaker voltage will be maximum. FIG. 3b is an enlargement of the graphs of FIG. 3a, it illustrates the last two switching cycles and speaker voltage at period t2.

What is needed is a click noise-less startup and shutdown method that eliminates a need of a speaker cut-off switch, saving system cost and space.

SUMMARY OF THE INVENTION

It is an object of the present invention to eliminate the click noise in Class D audio amplifiers without the use of the bulky, expensive, and unreliable speaker relay.

Provided is a method of minimizing an audible click noise from a speaker in a Class D audio power amplifier upon shutdown or startup of a switching stage having two switches series connected at a node, the speaker being connected to the node via an output filter comprising an inductor and a capacitor, the switches being controlled by a controller. The method including the steps of determining a timing interval at the node to transition a peak voltage of the capacitor, the capacitor voltage being a speaker voltage; and eliminating the audible transient voltage excursion across the speaker that causes a click noise during the timing interval, wherein at startup ON and OFF times of the switches are incrementally increased from zero to a normal mode and at shutdown the ON OFF times of the switches are incrementally decreased from the normal mode to zero.

Other features and advantages of the present invention will become apparent from the following description of the invention that refers to the accompanying drawings.

DETAILED DESCRIPTION OF EMBODIMENTS OF THE INVENTION

The present invention intelligently selects the startup and shutdown timing interval t1 (FIGS. 4a-4c and 5a-5c) to eliminate the audible transient voltage excursion across the speaker, which causes the click noise. Selection of the timing interval at the switch node VS (FIG. 1) is determined by considering the energy storage within the output inductor 2 during switching to determine the required timing to systematically transition a peak voltage of the capacitor 3, which is also the speaker voltage since the relay 6 is not being used. The energy, which is proportional to a square of a current through the inductor 2, and voltage can either be calculated or sensed to determine the required timing and is applicable to higher order and/or multistage output filters as well.

Additionally, by increasing the switching frequency during the selected timing interval, the present invention reduces the circulating energy within the output filter during the shutdown and startup transients. This frequency change is beneficial to further reduce click noise, but the proposed method will work adequately without it.

Transitioning between the different switching frequencies, by itself, can cause click noise as this is another transient from one energy state to another. For this transient, the above intelligent timing interval scheme can be utilized. Alternatively, since during both of these different switching frequency intervals, the feedback and control is still operational. Any resultant transient due to improper timing will be suppressed by a control loop through modulation of the duty cycle (not shown).

Figure 4A:
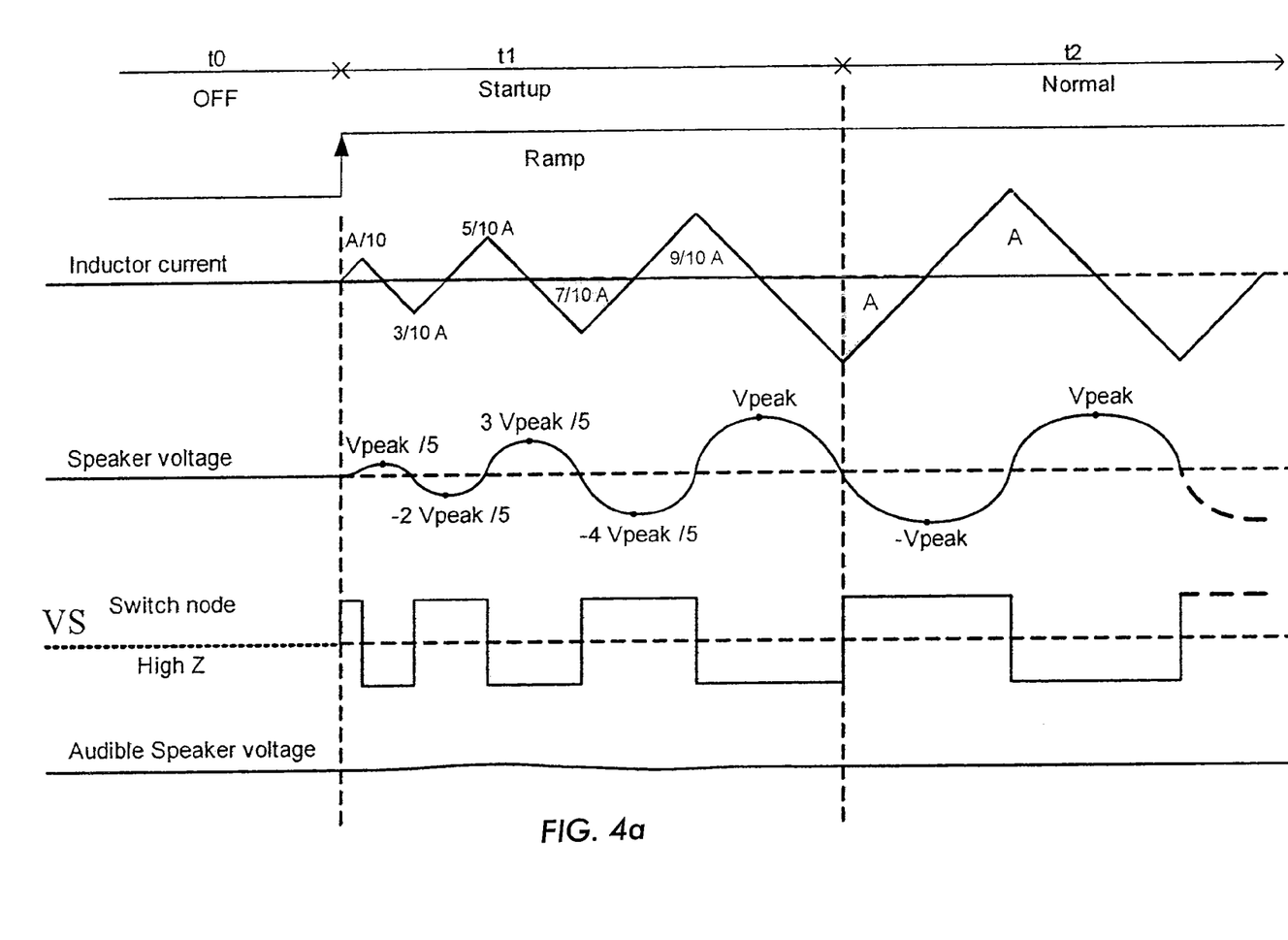
FIGS. 4a-4c are graphs illustrating changes in inductor current, speaker voltage, and switching node signal values of a Class D audio amplifier of a preferred embodiment of the present invention at startup.
Figure 5A:
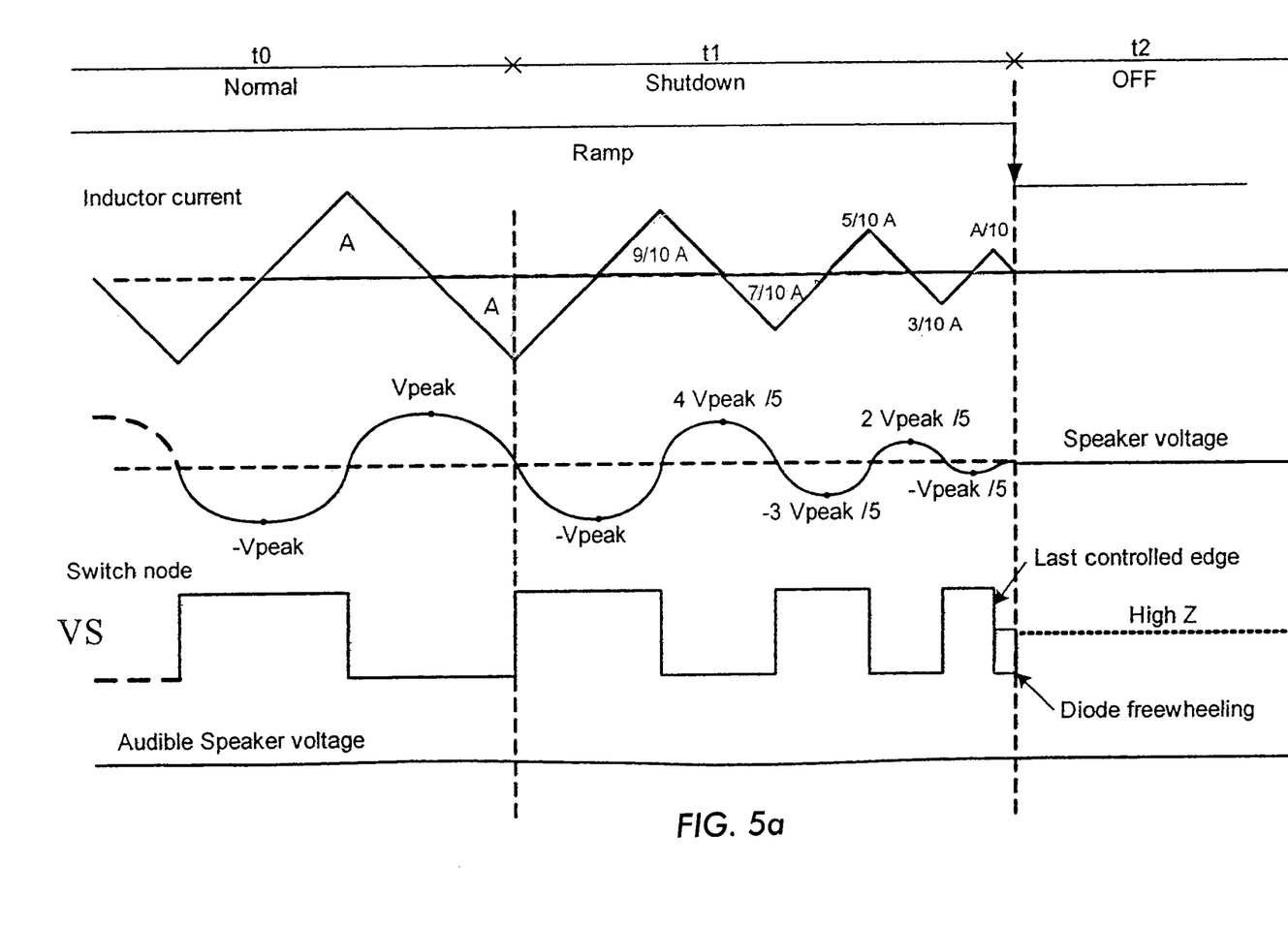
FIGS. 5a-5c are graphs illustrating changes in inductor current, speaker voltage, and switching node signal values of the Class D audio amplifier of a preferred embodiment of the present invention at shutdown.

In accordance with the present invention, the turn ON and turn OFF events are selectively timed at startup, as shown in FIG. 4a, to systematically increase a peak voltage at the speaker every half cycle and at shutdown, as shown in FIGS. 5a, to systematically decrease a peak voltage at the speaker every half cycle. The waveform examples show the speaker voltage being systematically increased/decreased through five steps or five transitions of the voltage at the switching node VS.

Figure 4B:
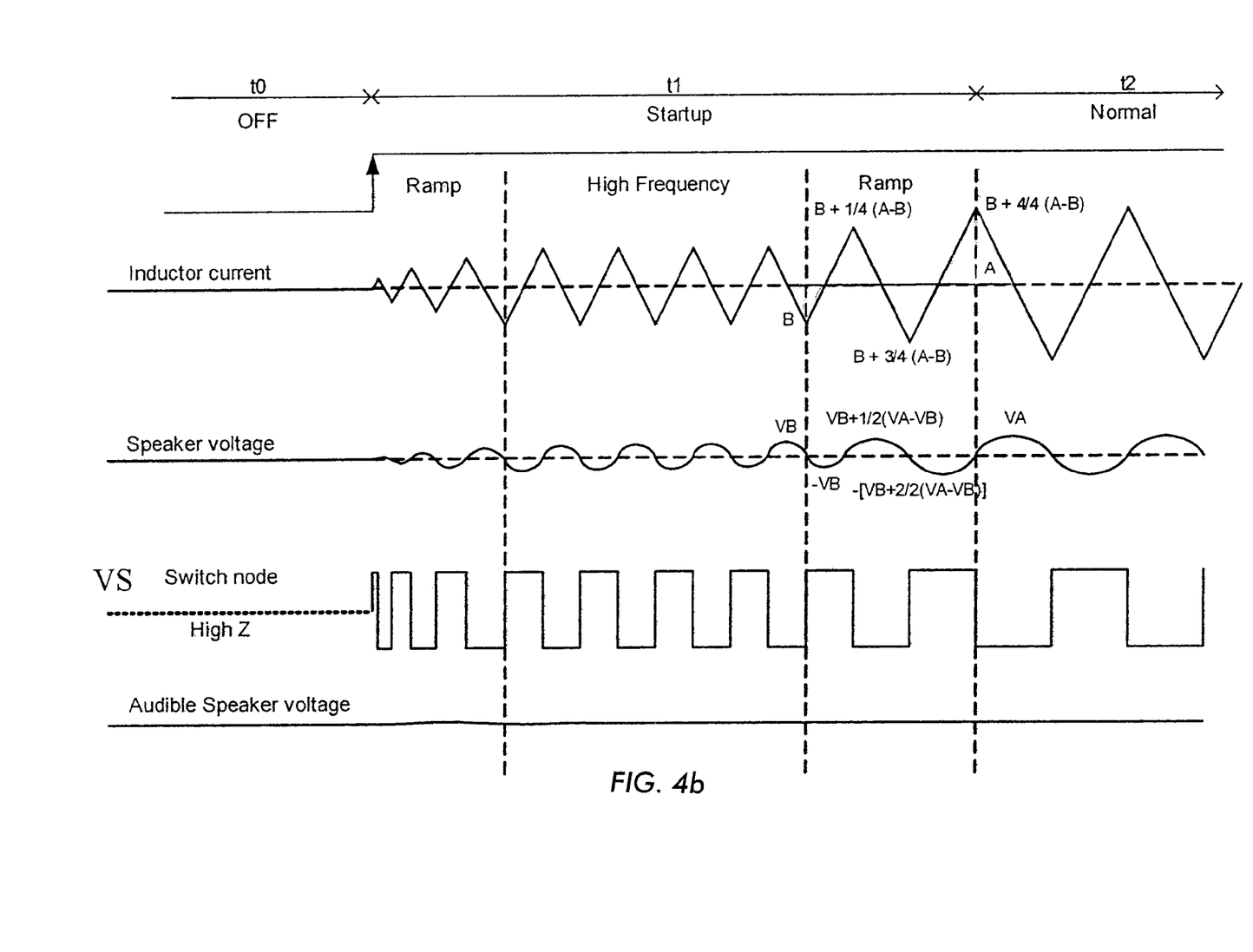
Figure 4C:
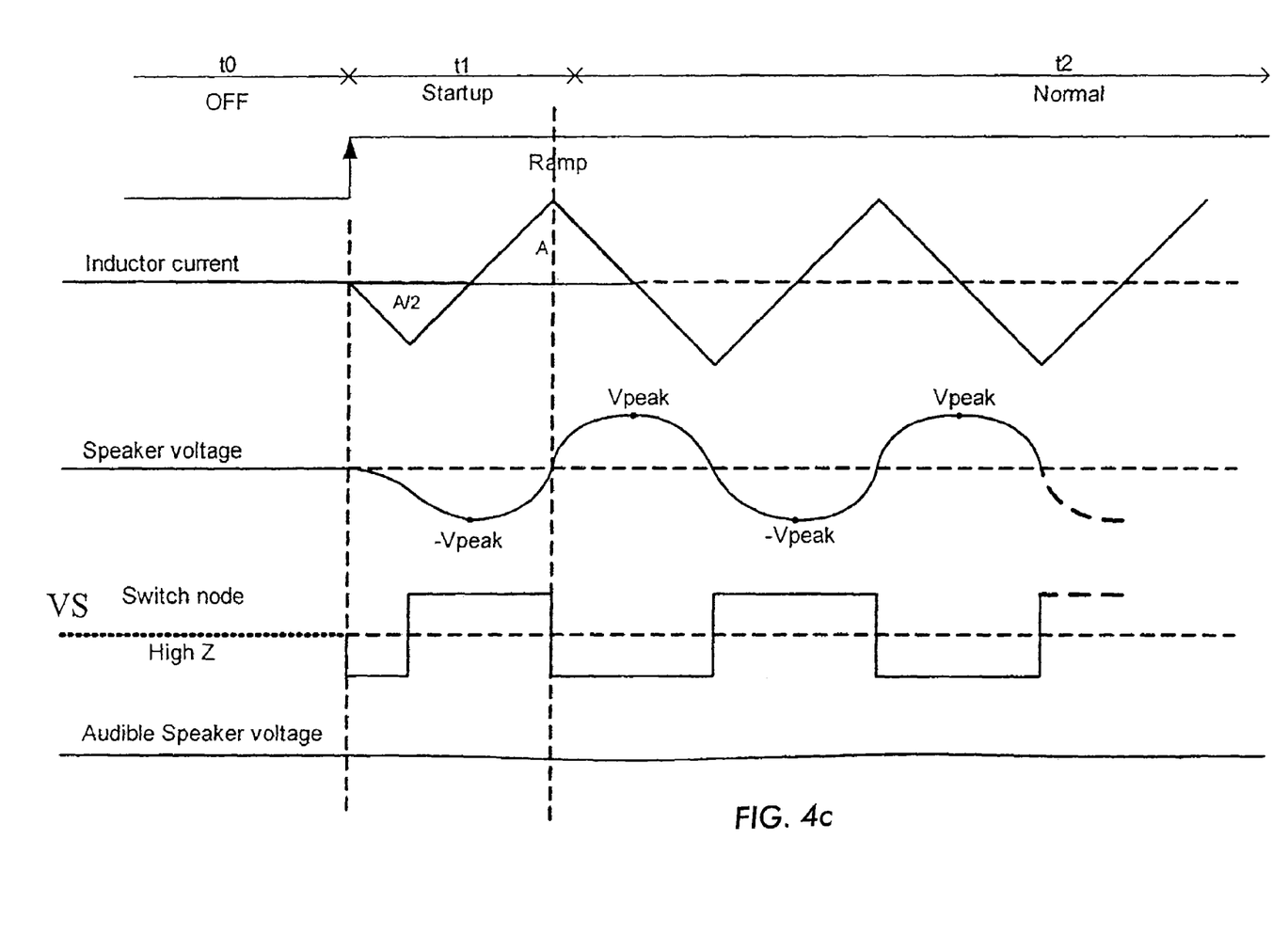

In the case of FIG. 4a, the energy flow is such that the absolute peak speaker output voltage increases as follows per each half cycle: ⅕, ⅖, ⅗, ⅘, 5/5 of a peak voltage Vpeak to reach the voltage Vpeak after 5 switching events, at which point normal switching operation is started. FIGS. 4b and 4c illustrate alternative embodiments of transition from the startup to normal mode sequence of the present invention.

Figure 5B:
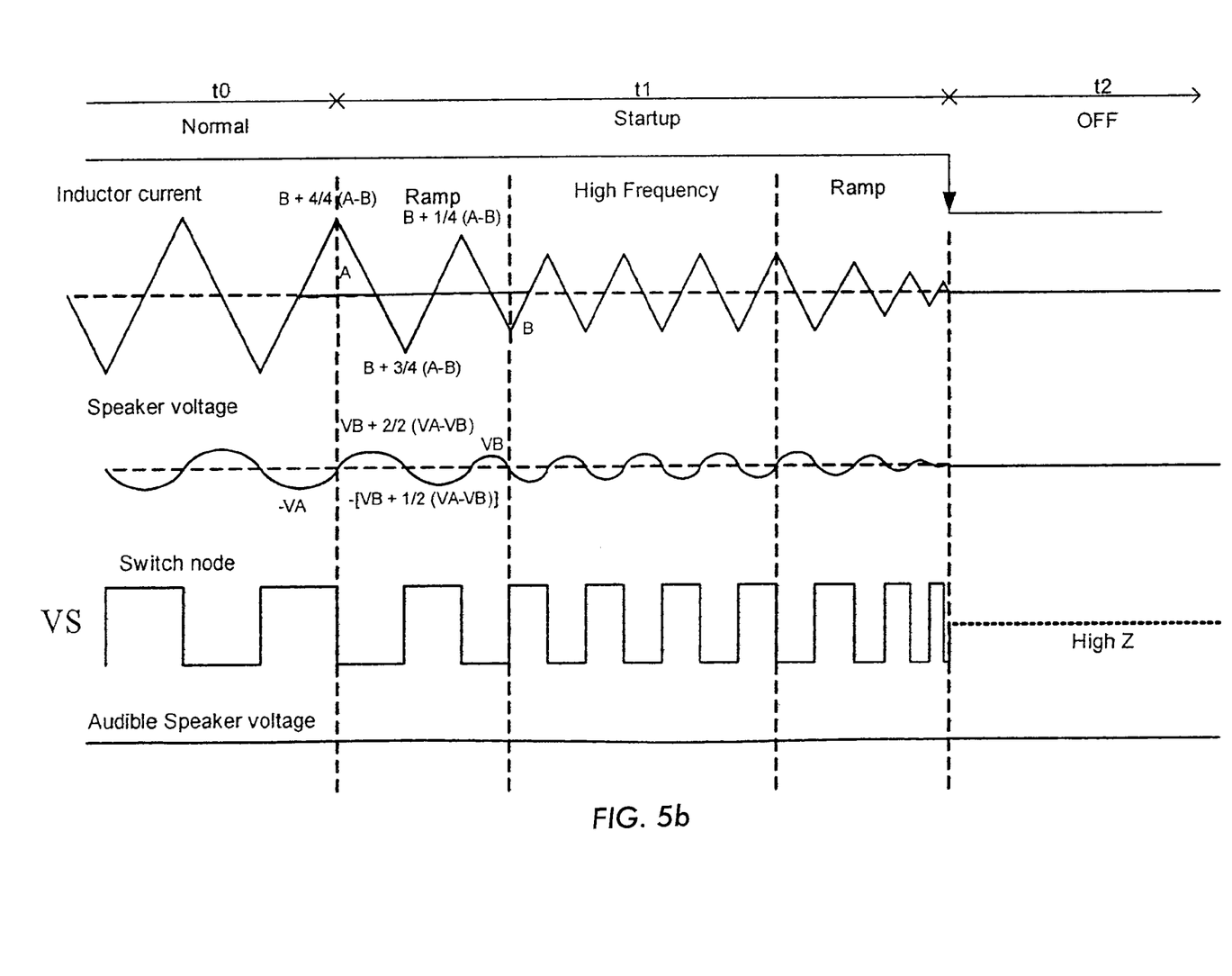
Figure 5C:
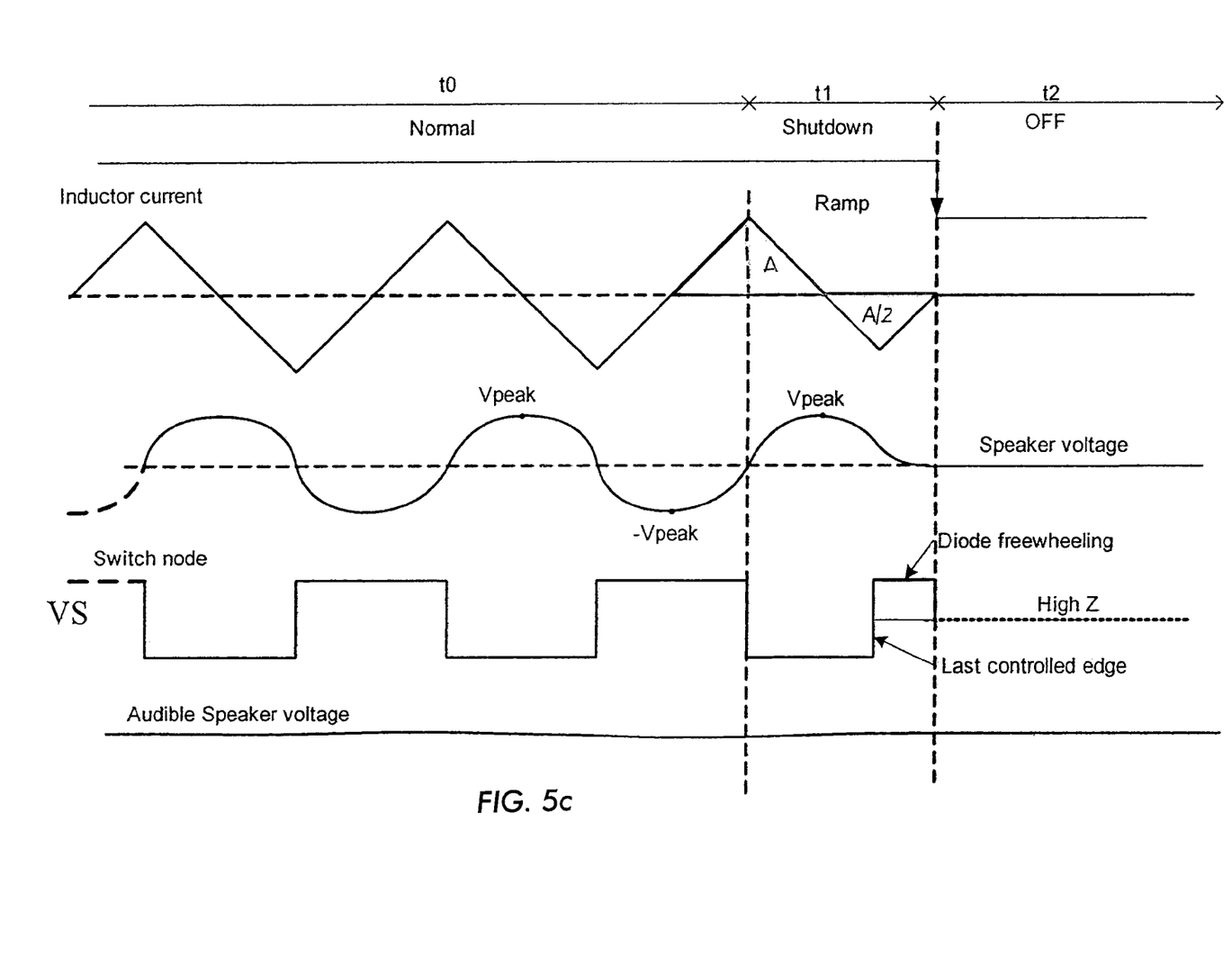

Conversely, in the case of FIG. 5a, the energy flow is such that the absolute peak speaker output voltage decreases as follows per each half cycle: ⅕, ⅖, ⅗, ⅘, 5/5 of a peak voltage Vpeak to reach the zero voltage after 5 switching events, at which point normal switching operation is shutdown. FIGS. 5b and 5c illustrate alternative embodiments of transition from the normal to shutdown mode sequence of the present invention.

In general, the timing for the n'th switching event for a given number of voltage steps (N) at startup is given by:

$$t(n) = T/4 \times \left[\sqrt{(n/N + 1/(2N))} + \sqrt{(n/N - 1/(2N))}\right]$$
$$t(0) = T/4 \times \left[\sqrt{(1/2N)}\right]$$
$$t(N) = T/4 \times \left[1 + \sqrt{(1 - 1/(2N))}\right]$$

and at shutdown, by:

$$t(n) = T/4 \times \left[\sqrt{(1 - n/N + 1/(2N))} + \sqrt{(1 - n/N - 1/(2N))}\right]$$
$$t(N) = T/4 \times \left[\sqrt{(1/2N)}\right]$$
$$t(0) = T/4 \times \left[1 + \sqrt{(1 - 1/(2N))}\right]$$

The present invention provides the following key benefits for Class D amplifiers having startup and shutdown state with an output switching devices in an OFF state:

normal operation of the amplifier is not affected because noise elimination is only performed during the startup to normal and normal to shutdown state transitions;

the startup and shutdown sequences are consistent and repeatable, i.e., the same sequence is activated every time with the same behavior and resultant click noise reduction to enter the normal and shutdown modes respectively;

the switching frequency is increased to reduce the maximum energy storage within the output filter as the amplifier is transitioning to the normal or shutdown mode respectively, noise elimination functions independent of this additional improvement feature (FIGS. 4b and 5b); and the timing of the startup and shutdown switching action is created such that, the voltage across the output capacitor and speaker is systematically increased to normal operating level and reduced to zero, respectively.

Therefore, in the shutdown state, after the switching has stopped, the remaining energy in the inductor will transfer to the output capacitor resulting in a zero residual voltage (thus zero energy) across the speaker terminals. Since there is no residual energy to be dissipated, there is no voltage transient and the audible click noise is eliminated.

Although multiple sensing/design techniques are possible to determine this exact shutdown timing, the aim is always to turn-off the switching action to result in zero voltage at the speaker. This can be achieved in one or multiple switch timing steps. If multiple steps are used, the resultant peak speaker voltage after each step is systematically reduced to zero through a number of equal incremental voltage steps.

Similarly, in the startup state, once switching has started, energy input to the inductor is limited and systematically increased to normal operating levels. The scheme is to control the peak output filter capacitor and speaker voltage. The peak speaker voltage is systemically increased per switching interval (half-cycle) to reach the normal operating peak voltage after a number of equal incremental voltage steps.

Although multiple sensing/design techniques are possible to determine this exact startup timing, the aim is always to turn off the switching action to result in the normal peak voltage across the speaker. If multiple steps are used, the resultant peak speaker voltage after each step is systemically increased towards the nominal value through a number of equal incremental voltage steps. This can also be done by increasing the peak speaker voltage every cycle (or other integer multiples of the half-cycle) instead of every half-cycle.

Energy steps (all in multiples of 1/N of peak) are +1; −3; +5; −7; . . . etc., or −1; +3; −5; +7; . . . etc. Also smaller increments may be used as in +1; −2; +3; −4; +5; . . . etc., or −1; +2; −3; +4; −5; . . . etc.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of minimizing an audible click noise from a speaker in a Class D audio power amplifier upon shutdown or startup of a switching stage having two switches series connected at a node, the speaker being connected to the node via an output filter comprising an inductor and a capacitor, the switches being controlled by a controller, the method comprising the steps of:

determining a timing interval at the node to transition a peak voltage of the capacitor, the capacitor voltage being a speaker voltage; and eliminating the audible transient voltage excursion across the speaker that causes a click noise during the timing interval, wherein at startup ON and OFF times of the switches are incrementally increased from zero to a normal mode and at shutdown the ON OFF times of the switches are incrementally decreased from the normal mode to zero.

2. The method of claim 1, wherein the speaker is connected to the node without a speaker cut-off switch.

3. The method of claim 1, wherein energy stored within the inductor during switching is considered in the determining step, the energy being proportional to a square of a current through the inductor.

4. The method of claim 3, wherein the energy and the capacitor voltage are determined by a method selected from at least one of calculating and sensing.

5. The method of claim 4, wherein the energy and capacitor voltage determinations are applicable to higher order and multistage output filters.

6. The method of claim 3, further comprising a step of increasing a switching frequency during the timing interval, increase in the switching frequency further reduces the maximum energy storage within the output filter as the Class D audio power amplifier is transitioning to the from the startup to normal mode and from normal to shutdown mode, wherein the increasing a switching frequency reduces the click noise.

7. The method of claim 3, further comprising the steps of:
using a control loop feedback to determine the transient due to improper timing interval; and
modulating a duty cycle to suppress the transient.

8. The method of claim 1, wherein at startup the turn ON and turn OFF times are selectively timed to systematically increase the peak voltage every half cycle to a normal operating level.

9. The method of claim 1, wherein at shutdown the turn ON and turn OFF times are selectively timed to systematically decrease the peak voltage every half cycle until reduced to zero.

10. The method of claim 1, wherein the startup and shutdown sequences are repeated to provide consistent resultant click noise reduction at entry into the normal and shutdown modes.

* * * * *